US011914289B2

(12) United States Patent
Welte et al.

(10) Patent No.: US 11,914,289 B2
(45) Date of Patent: Feb. 27, 2024

(54) METHOD AND APPARATUS FOR DETERMINING AN EFFECT OF ONE OR MORE PIXELS TO BE INTRODUCED INTO A SUBSTRATE OF A PHOTOLITHOGRAPHIC MASK

(71) Applicant: Carl Zeiss SMS Ltd., D.N. Misgav (IL)

(72) Inventors: Joachim Welte, Darmstadt (DE); Uri Stern, Kiryat Tivon (IL); Kujan Gorhad, Northern Region (IL); Vladimir Dmitriev, Tzurit (IL)

(73) Assignee: Carl Zeiss SMS Ltd., D.N. Misgav (IL)

( * ) Notice: Subject to any disclaimer, the term of this patent is extended or adjusted under 35 U.S.C. 154(b) by 322 days.

(21) Appl. No.: 17/140,340

(22) Filed: Jan. 4, 2021

(65) Prior Publication Data

US 2021/0124259 A1    Apr. 29, 2021

Related U.S. Application Data

(63) Continuation of application No. PCT/IB2018/055284, filed on Jul. 17, 2018.

(51) Int. Cl.
*G03F 1/84* (2012.01)
*G03F 1/80* (2012.01)

(52) U.S. Cl.
CPC ...... *G03F 1/84* (2013.01); *G01N 2201/06113* (2013.01); *G01N 2201/062* (2013.01); *G03F 1/80* (2013.01)

(58) Field of Classification Search
CPC .......... G03F 1/84; G03F 1/80; G03F 7/70516; G03F 1/72; G01N 21/23; G01N 21/55;
(Continued)

(56) References Cited

U.S. PATENT DOCUMENTS 9,658,527 B2    5/2017  Dmitriev
9,753,366 B2 *  9/2017  Dmitriev ............... G03F 1/72
(Continued)

FOREIGN PATENT DOCUMENTS

CN    1760763       4/2006    ............ G03F 7/20
CN    102439419     5/2012    ............ G01N 21/23
(Continued)

OTHER PUBLICATIONS

DE-102006054820-A1 English Translation (Year: 2008).*
(Continued)

*Primary Examiner* — Mark F. Huff
*Assistant Examiner* — Moriah S. Smoot
(74) *Attorney, Agent, or Firm* — Fish & Richardson P.C.

(57) ABSTRACT

The present invention refers to a method for determining an effect of one or more of pixels to be introduced into a substrate of a photolithographic mask, the photolithographic mask having one or more pattern elements, wherein the one or more pixels serve to at least partly correct one or more errors of the photolithographic mask, the method comprising: determining the effect of the one or more introduced pixels by determining a change in birefringence of the substrate of the photolithographic mask having the one or more pattern elements.

19 Claims, 10 Drawing Sheets

(58) Field of Classification Search
CPC ............. G01N 21/59; G01N 2021/558; G01N 2201/06113; G01N 2201/062
See application file for complete search history.

(56) References Cited

U.S. PATENT DOCUMENTS

| | | | |
|---|---|---|---|
| 2003/0021026 A1 | 1/2003 | Allan et al. | |
| 2005/0264802 A1* | 12/2005 | Shibata | H01L 21/67028 356/237.5 |
| 2006/0077373 A1 | 4/2006 | Mulkens et al. | |
| 2006/0234139 A1 | 10/2006 | Watson et al. | |
| 2007/0009811 A1* | 1/2007 | Nagahama | G03F 1/84 430/311 |
| 2009/0168191 A1* | 7/2009 | Takehisa | G03F 1/84 359/665 |
| 2012/0009511 A1 | 1/2012 | Dmitriev | |
| 2012/0084044 A1* | 4/2012 | Dmitriev | B82Y 10/00 702/127 |
| 2012/0092669 A1 | 4/2012 | Fiolka et al. | |
| 2012/0257184 A1 | 10/2012 | Mulkens | |
| 2015/0017589 A1 | 1/2015 | Saenger et al. | |
| 2015/0160550 A1 | 6/2015 | Kim et al. | |
| 2017/0219920 A1 | 8/2017 | Huber | |
| 2019/0170991 A1 | 6/2019 | Seesselberg et al. | |

FOREIGN PATENT DOCUMENTS

| | | | | |
|---|---|---|---|---|
| CN | 106575076 | | 4/2017 | ............. G03F 1/22 |
| DE | 102006054820 A1 | * | 5/2008 | ............. B82Y 10/00 |
| EP | 1962326 B1 | * | 6/2012 | ............. B82Y 10/00 |
| JP | 2004-536454 | | 12/2004 | ........... H01L 21/027 |
| JP | 2012-022323 | | 2/2012 | ............... G03F 1/72 |
| JP | 2012-088712 | | 5/2012 | ............... G03F 1/00 |
| JP | 2012-520993 | | 9/2012 | ............. G01N 21/23 |
| JP | 2012-222355 | | 11/2012 | ........... H01L 21/027 |
| JP | 2013-539543 | | 10/2013 | ............... G02B 5/30 |
| JP | 2015-509662 | | 3/2015 | ........... H01L 21/027 |
| JP | 2017-103309 | | 6/2017 | ........... H01L 21/027 |
| JP | 2018-508048 | | 3/2018 | ............... G03F 1/72 |
| JP | 2018-076204 | | 5/2018 | ............. C03B 33/02 |
| TW | I603157 | | 10/2017 | ............... G03F 7/20 |
| TW | 201816505 | | 5/2018 | |
| WO | WO 2010/105757 | | 9/2010 | ............. G01N 21/23 |
| WO | WO 2012/012177 | | 1/2012 | ............... G01N 5/30 |
| WO | WO 2013/123973 | | 8/2013 | ............... G03F 7/20 |
| WO | WO 2016/144690 | | 9/2016 | ............... G03F 1/82 |

OTHER PUBLICATIONS

International Search Report and Written Opinion of the International Search Authority for International Application No. PCT/IB2018/055284, dated Apr. 5, 2019.
Taiwan Office Action and Search Report for Taiwan Application No. TW 108125096 dated Sep. 28, 2020 (with English Translation).
Notification of Reasons for Refusal issued by the Japanese Patent Office for Application No. JP 2021-502613, dated Feb. 16, 2022 (with English Translation).
Notice of Reasons for Rejection issued by the Korean Intellectual Property Office for Application No. KR 10-2021-7004553, dated Feb. 8, 2023 (English Translation).
The First Office Action issued by the Chinese Patent Office for Application No. CN 201880095686.3, dated Oct. 16, 2023 (with English Translation).

* cited by examiner

METHOD AND APPARATUS FOR DETERMINING AN EFFECT OF ONE OR MORE PIXELS TO BE INTRODUCED INTO A SUBSTRATE OF A PHOTOLITHOGRAPHIC MASK

CROSS-REFERENCE TO RELATED APPLICATIONS

This application is a continuation of and claims priority under 35 U.S.C. § 120 from PCT Application No. PCT/IB2018/055284, filed on Jul. 17, 2018, the entire content of which is incorporated herein by reference. This application is related to U.S. Pat. No. 9,658,527, titled "Correction of errors of a photolithographic mask using a joint optimization process," the entire content of which is incorporated herein by reference.

TECHNICAL FIELD

The present invention relates to the field of determining an effect of one or more pixels to be introduced into a substrate of a photolithographic mask. In particular, the present invention refers to a method and an apparatus for determining a calibration routine for the correction of errors of a photolithographic mask.

BACKGROUND

As a result of the constantly increasing integration density in the semiconductor industry, photolithographic masks must project smaller and smaller structures onto a photosensitive layer, i.e. a photoresist on wafers. In order to fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. In the future, photolithographic masks will use significantly smaller wavelengths in the extreme ultraviolet (EUV) wavelength range of the electromagnetic spectrum (approximately 10 nm to 15 nm).

Consequently, the manufacturing of photolithographic masks which fulfil the increasing resolution requirements is becoming more and more complex, and thus more and more expensive as well. It is not unusual that photolithographic masks, photomasks or simply masks have defects at the end of their manufacturing process. Due to the time-consuming mask fabrication process, defects of photomasks should be repaired whenever possible.

Photolithographic masks can have several kinds or types of errors. An important type of defect of photolithographic masks is mask image placement errors or registration errors. This type of error or defect occurs if one or more pattern elements of a pattern arranged on a photolithographic mask are not precisely at their positions which are predetermined by the layout data of the mask.

WO 2013/123973 describes a method for compensating polarization defects of optical elements in an optical system caused by a birefringence of the material of the optical component by introducing one or more arrangements of pixels into the optical element, preferably in an optically not relevant part of the optical element.

A further type of errors is an inhomogeneity of the optical transmission across the area of the photolithographic mask which leads to a respective variation of the optical intensity dose or simply dose applied to the photoresist on the wafer when illuminating a wafer by use of a mask. The variation of the locally applied optical intensity dose or simply dose results in a fluctuation or a variation of the structure dimension of a pattern element in the developed photoresist. The uniformity of the imaging of a pattern element across the area of the photolithographic mask is called critical dimension uniformity (CDU).

Further, another important type of defect is overlay defects or an On Product Overlay (OPO). This error type is linked to a shift of a feature element on a wafer which is imaged by two or more subsequent illumination steps using two or more different photomasks. Moreover, a bending of the substrate of a photomask is a further type of errors.

The applicant has disclosed methods for correcting these and other errors of photolithographic masks by introducing or writing pixels into a substrate of a photomask. For example, some of these methods are described in the U.S. Pat. No. 9,658,527 B2 of the applicant. Further, the applicant has constructed several tools (e.g., RegC®, ForTune®) which are already routinely used for reliably correcting several error types of photomasks. Nevertheless, there is room for a further improvement of these defect correction processes.

It is therefore one aspect of the present invention to provide a method and an apparatus for improving the above-mentioned methods of correcting defects of a photolithographic mask.

SUMMARY

According to an aspect of the invention, a method according to patent claim 1 is provided. In an embodiment, a method for determining an effect of one or more of pixels to be introduced into a substrate of a photolithographic mask, wherein the photolithographic mask has one or more pattern elements, and wherein the one or more pixels serve to at least partly correct one or more errors of the photolithographic mask, comprises: determining the effect of the one or more introduced pixels by determining a change in birefringence of the substrate of the photolithographic mask having the one or more pattern elements.

Pixels which are introduced into a substrate of a photolithographic mask to correct various types of errors or defects of a photolithographic mask can locally modify the optical transmission of the mask substrate. In the following, the benefit of the inventive method is illustrated for the example of correcting registration errors of a mask. However, the inventive method is not restricted to the correction of registration errors of photolithographic masks.

Pixels introduced or written into a mask substrate to correct for example registration errors, generate small scattering centers for the optical radiation transmitting the mask substrate. For example, pixels which correct one or more registration defects may introduce local inhomogeneities in the optical transmission of the mask when a repaired mask having pixels in its substrate is operated in a photolithographic illumination system. Thus, the introduction of pixels correcting registration errors would result in a critical dimension (CD) variation across the photomask or a critical dimension uniformity (CDU) problem of the photolithographic mask.

To avoid a CDU problem when correcting registration errors, a distribution of a second type of pixel can simultaneously be determined with the determination of the first type of pixel correcting the registration errors. The second type of pixel predominantly locally scatters the optical radiation impacting on the pixel(s) in a defined manner. The second type of pixels does essentially not locally change the density of the substrate. Typically, the second type of pixel is introduced into a mask substrate together with the first type of pixel which corrects for example the registration error(s) of the photolithographic mask.

Typically, both, the first type of pixel and the second type of pixel are not homogeneously distributed in the substrate of a photolithographic mask to be corrected. The correcting effect of the one or more pixels depends on the details of the pixel writing process. Thus, the laser beam parameters of the laser system introducing the pixel(s) must precisely be controlled. Further, there exists a maximum of the allowed optical transmission variation which can be corrected by a scanner or a stepper which uses the corrected mask in a lithography process to project the pattern elements of the mask onto a photoresist arranged on a wafer. Consequently, the pixel writing process has to be calibrated to ensure the allowed optical transmission variation is not surpassed at a position of the mask.

Presently, the optical transmission variation of the photolithographic at the actinic wavelength is used to calibrate the pixel writing process and to determine the maximum amount of allowed optical transmission variation caused by an error correction process by introducing the one or more pixels into the substrate of the photolithographic mask.

This approach has two drawbacks: (a) The primary parameter which is linked to a change of the mask substrate caused by the introduction of the one or more pixel(s) into substrate is not the optical transmission, but the stress generated by the error correcting pixel(s). This means that the present calibration process uses an indirect quantity for describing the effect of the one or more pixels and for determining the maximum tolerable optical transmission variation. (b) Further, and even more important, future EUV masks will be reflective optical elements. The actinic wavelength can no longer be used in transmission for calibrating an error correction process based on the introduction of pixel(s) into the substrate of a photolithographic mask. Thus, using the presently established calibration process also for EUV masks would result in a change of the workflow of the defect correction, since the optical transmission calibration would have to be done on an uncoated EUV mask substrate.

The inventive method considers a change in birefringence caused by the stress in the mask substrate due to the writing of one or more pixels which correct the mask defect. By using the primary effect of the error correcting pixels, namely the stress birefringence for calibrating the defect correction process, both drawbacks of the present calibration process can be avoided.

Determining the change in birefringence can comprise measuring a birefringence of the substrate prior to introducing the one or more pixels and after introducing the one or more pixels into the substrate.

Typically, optically isotropic materials are used for substrates of photomasks, as for example quartz substrates or LTE (Low Temperature Expansion) materials. For these materials, the induced birefringence is directly proportional to the stress optical coefficient K (unit: [mm$^2$/N]). It can be measured as the difference in the optical path length or retardation $\Delta$ between two incident plain waves oriented parallel and perpendicular to the main axis of stress which transmit the sample at a measurement position.

The one or more errors can comprise at least one of: a registration error, an optical transmission variation across the substrate, an overlay defect, and a bending of the substrate of the photolithographic mask.

This list of correctable defects is not complete. For example, polarization defects of photolithographic masks can also be corrected by introducing pixel(s) into the substrate of the photolithographic mask.

In this application, the term "photolithographic mask" also includes templates for the nanoimprint technology.

The one or more introduced pixels may not have an effect on the polarization of an optical radiation which has been modified by the one or more pattern elements of the photolithographic mask. This is correct for EUV masks; the EUV photons do not pass the layer where the pixels are arranged.

Determining the effect of the one or more introduced pixels can comprise: determining the change in the birefringence as a function of at least one laser beam parameter of a laser system used for introducing the one or more pixels into the substrate of the photolithographic mask.

The inventive method can further comprise the step of controlling the at least one laser beam parameter of the laser system based on the determined change in birefringence when writing the one or more of pixels into the substrate of the photolithographic mask in order to correct the one or more errors of the photolithographic mask By determining a change or a variation of the birefringence caused by the stress of introducing one or more pixels into the substrate depending on one or more laser beam parameters allows the determination of a calibration curve which can be used for controlling the pixel writing process.

Determining a birefringence variation can comprise using a transmissive optical birefringence measurement system using a wavelength which is larger than the actinic wavelength of the photolithographic mask. Further, determining the birefringence variation can comprise using a reflective optical birefringence measurement system using a wavelength which is larger than the actinic wavelength of the photolithographic mask.

Using the stress birefringence as the quantity to determine the stress induced by the writing of error correcting pixel(s) into a mask substrate allows a de-coupling of the determination of the pixel effects from the actinic wavelength. Thus, the wavelength for measuring the stress birefringence can be selected independently of the actinic wavelength. Rather, the wavelength for measuring the stress birefringence can be adapted to the optical properties of the mask substrate so that the stress birefringence can be determined with high precision.

The wavelength of the transmissive optical birefringence measurement system can be in the visible wavelength range.

Substrates of EUV masks do not transmit EUV photons, but are typically at least partially transmissive in the visible wavelength range. Therefore, the inventive method can be used to directly determine the stress birefringence caused by the defect correction process by writing one or more pixels for both, conventional transmissive photolithographic masks irrespective of their actinic wavelength and future EUV masks also independent of their specific actinic wavelengths.

The at least one laser beam parameter can comprise at least one of: a power of the laser beam, a pulse length, a pulse density, a focus width, a focus depth, a wavelength, a wave front, or a polarization of the laser beam.

The wave front describes a shape of the wave front of the electromagnetic radiation which generates the one or more pixels in the substrate of a photolithographic mask.

The defined method can further comprise the step of: linking the change in birefringence with a stress model of one or more pixels to be introduced into the substrate of the photolithographic mask.

The method defined above can comprise: determining an optical transmission variation of the substrate as a function of the at least one laser beam parameter.

This step allows connecting the conventional calibration process with the new calibration process explained in this application. This step is also necessary for linking the stress birefringence with the optical transmission variation.

The pulse length, the pulse density, the focus width, the focus depth, the wave front, and the polarization of the laser beam can be fixed and the power of the laser beam can be varied as a parameter.

The defined method can further comprise the step of: linking the change in birefringence with the optical transmission variation caused by the one or more pixels to be introduced into the substrate, wherein the at least one laser beam parameter is a parameter.

It is possible to establish a relation between a stress birefringence and an induced optical transmission variation for each type of substrate of a photolithographic mask. This means that the optical transmission variation of the mask substrate can be deduced to the amount of stress introduced into the substrate during a pixel writing process.

Controlling the at least one laser beam parameter can comprise limiting a numerical value of the at least one laser beam parameter so that introducing the one or more pixels into the substrate does locally not exceed a predetermined threshold of the variation of the optical transmission of the substrate of the photolithographic mask.

Based on a calibration process, wherein the stress birefringence is determined as a function of the optical transmission variation with the at least one laser beam parameter as a parameter, it can be secured that the error correction process by the writing pixel(s) into the mask substrate effectively corrects the defects of a photolithographic mask without introducing one or more new errors which cannot be corrected by writing further pixels into the substrate in a second error correction process.

The defined method can further comprise the step of determining an optical transmission variation of the substrate at the wavelength used by the laser system for introducing the one or more pixels into the substrate. The substrate can comprise a substrate for a photolithographic mask for an extreme ultraviolet (EUV) wavelength range.

As already described above, the stress introduced into a mask substrate by introducing one or more pixels into the substrate depends on at least one laser beam parameter. The at least one laser beam parameter can be the power of the laser beam, if the other above-mentioned laser beam parameters have been fixed. A substrate, in particular a substrate of an EUV mask can have an optical absorption which cannot be neglected at the wavelength at which the laser system generating the pixels operates when determining at least one laser beam parameter. In particular, the optical absorption of photomasks can vary from batch to batch. If this effect is not considered, the at least one actual laser beam parameter can deviate from the determined laser beam parameter at the position where the pixel is generated. Thus, the error correction process is not optimal or may even fail completely.

Determining the optical transmission variation of the substrate can comprise determining a variation of the optical transmission as a function of a lateral position of the substrate of the photolithographic mask.

Typically, the optical transmission can vary across an EUV mask substrate. Therefore, it is necessary to take into account the variation of the optical attenuation of the substrate at the pixel writing wavelength for a precise defect correction by pixel writing.

A lateral position of a mask is a position in the plane of the photolithographic mask (x-direction and y-direction). The z-direction is perpendicular to the mask plane.

The defined method can further comprise the step of determining an optical transmission variation as a function of a depth and a lateral position of the substrate where the one or more pixels are to be introduced into the substrate.

Depending on the type of error to be corrected of a photolithographic mask, the one or more pixels can be introduced in various depths of the mask substrate. Thus, the attenuation of the laser beam within the substrate can be dependent on the type of error to be corrected. For optimizing the defect correction process, it is favorable to consider the depth into which the parameters are introduced.

The substrate can have a coating on a rear surface of the substrate, wherein the coating is electrically conductive and at least partially optically transmissive at the wavelength at which the one or more pixels are to be introduced into the substrate when determining the at least one laser beam parameter.

The substrates of EUV masks can have a coating on their rear surface. The coating is typically electrically conductive so that the EUV mask can be fixed to an electronic chuck. To correct defects of EUV masks pixel(s) are typically introduced via the rear side of the mask substrate. Typically, a multi-layer structure acting as a reflective element for EUV radiation is arranged on a front side of the mask substrate. Thus, the front side of an EUV mask is normally not accessible for introducing pixel(s) into the mask substrate. It is therefore necessary that the electrically conductive rear side coating is at least partially optically transparent at the wavelength the pixel(s) are introduced into the substrate of the EUV mask.

The coating can comprise at least one material of: indium tin oxide (ITO), fluorine tin oxide (FTO), and antimony tin oxide (ATO). The thickness of the coating can comprise a range of 1 nm-200 nm, preferably 2 nm-100 nm, more preferred 3 nm-50 nm, and most preferred 4 nm-30 nm. Alternatively, the electrically conductive coating can comprise two layers. A first layer can comprise chromium nitride (CrN) having a thickness of 2 nm--50 nm, preferably 4 nm-30 nm, more preferred 6 nm-20 nm, and most preferred 8 nm-12 nm. A second layer can comprise a metal oxide layer, as for example a tantalum oxynitride layer, having a thickness of 50 nm-1000 nm, preferably 100 nm-800 nm, and preferred 200 nm-600 nm.

The method defined above can further comprise the step of determining the optical transmission variation of the substrate and/or the coating at the wavelength used by the laser system for introducing the plurality of pixels into the substrate.

The coating is often based on a trade-off between a low electrical resistance and a high optical transmission. The rear side coating of the substrate can have an optical absorption in the range of a few percent to a few tens of percent, depending on the material composition and the thickness of the coating. Therefore, it is highly beneficial to consider the optical attenuation of the coating when determining the at least one laser beam parameter used for writing the pixel(s).

Determining the optical transmission variation of the substrate and/or the coating can comprise determining a variation of the optical transmission as a function of a lateral position of the substrate of the photolithographic mask. Similar to the substrate, the optical transmission of the coating can fluctuate across the mask substrate. This can occur due to a location variation of the depth of the coating, and/or a local variation of the material composition, and/or a local variation of a doping of the coating.

Determining the optical transmission variation of the substrate can comprise determining an optical reflection of the substrate and determining an optical transmission of the substrate. Further, determining the optical transmission variation of the substrate and the coating can comprise determining an optical reflection of the substrate and the coating and determining an optical transmission of the coating and the substrate. The three quantities: reflection, absorption and transmission substantially characterize a dielectric material. By measuring two of these quantities the third one can be deduced.

The method defined above can further comprise the step of determining the optical transmission variation of the substrate and/or the coating as a function of the depth and the lateral position of the substrate where the one or more pixels are to be introduced into the substrate.

The error correction process can be optimized by adapting the pixel writing process to the optical properties of the mask substrate and the mask coating on the one hand and the depth into which the pixel(s) are introduced on the other hand.

The one or more pixels can comprise a first writing map having a first type of pixels for correcting the one or more errors, wherein the first writing map describes a distribution of the one or more pixels to be introduced in the substrate of the photolithographic mask.

The defined method can further comprise the step of determining a second writing map having a second type of pixels for correcting the optical transmission variation of the substrate based on the determined change in birefringence and/or the determined optical transmission variation of the substrate and/or the coating at the wavelength the one or more pixels are to be introduced into the substrate.

A computer program can comprise instructions for causing a computer system to perform the steps of the inventive method and of any of the aspects described above.

According to another aspect of the invention, an apparatus according to patent claim 16 is provided. In an embodiment, an apparatus for determining an effect of one or more pixels to be introduced into a substrate of a photolithographic mask, wherein the photolithographic mask has one or more pattern elements, and wherein the one or more pixels serve to at least partly correct one or more errors of the photolithographic mask, comprises: means for determining the effect of the one or more introduced pixels by determining a change in birefringence of the substrate of the photolithographic mask having the one or more pattern elements.

The means for determining the change in birefringence can comprise at least one of: a polarimeter, an ellipsometer, or a birefringence imaging system.

The means for determining the effect of the one or more introduced pixels can comprise means for determining a stress distribution on a surface of the photolithographic mask. The means for determining the stress distribution can comprise an apparatus for determining surface plasmon resonances. When precisely modelling the photomask response to internal stress, it is possible to use information on surface stress on either side of the mask to determine the pixel effect.

Directly determining a stress distribution on a mask surface is an alternative to the determination of the effect of pixels written into a mask substrate.

The inventive apparatus can further comprise an optical measurement system adapted to determine an optical reflection and/or an optical transmission of the substrate and/or a coating arranged on the substrate.

The apparatus can further comprise a pixel writing system used for correcting the one or more errors.

The means for determining the change in birefringence, the optical measurement system, and the laser system used for correcting the one or more errors can be combined in a single apparatus.

Finally, the apparatus can be adapted to execute the step of the inventive method and the steps of any of the aspects described above.

DESCRIPTION OF DRAWINGS

In order to better understand the present invention and to appreciate its practical applications, the following Figures are provided and referenced hereafter. It should be noted that the Figures are given as examples only and in no way limit the scope of the invention.

DETAILED DESCRIPTION

In the following, the present invention will be more fully described hereinafter with reference to the accompanying figures, in which exemplary embodiments of the invention are illustrated. However, the present invention can be embodied in different forms and should not be construed as limited to the embodiments set forth herein. Rather, these embodiments are provided so that this disclosure will be thorough and will convey the scope of the invention to persons skilled in the art.

In particular, the inventive method is described in the context of photolithographic masks. However, the person skilled in the art will appreciate that the defined method is not restricted to the application of correcting defective photolithographic masks. The inventive method can also be used for correcting defective templates 200 to be used in the nanoimprint lithography. In general, the inventive method can be applied to all transmissive optical elements which can be corrected by the introduction of one or more stress causing pixels. It is beneficially used for optical elements for which optical transmission uniformity is not a critical parameter.

Figure 1:
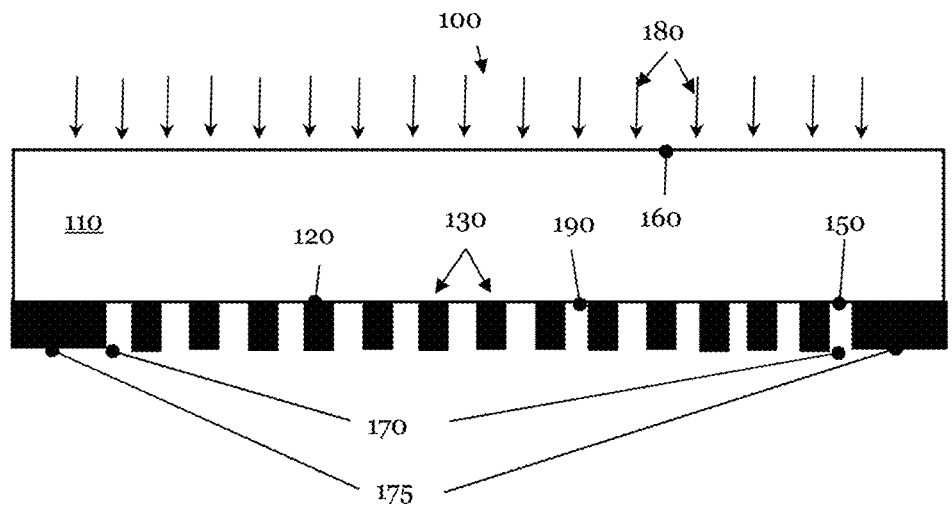
FIG. 1 shows in cross-section of a schematic view of a transmissive photolithographic mask.

FIG. 1 represents a schematic cross-section view of a transmissive photolithographic mask 100. The mask 100 comprises a substrate 110 having a first or front surface 150 and a second or rear surface 160. The substrate 110 must be transparent for the wavelength used for the illumination of the photoresist on a wafer. This wavelength is called actinic wavelength. The exposure wavelength 180 can be in the deep ultraviolet (DUV) spectral range of the electromagnetic spectrum, in particular around 193 nm. Typically, the substrate material comprises quartz. The substrate 110 typically has lateral dimensions of 152 mm×152 mm and a depth or height of essentially 6.35 mm. The substrate 110 of the photolithographic mask 100 has on its front surface 150 pattern elements 120 of a pattern 130 often fabricated from chromium which images pattern elements 120 predetermined by the layout data in a photoresist arranged on a wafer.

In the example depicted in FIG. 1, the mask 100 has an error 190 in the form of a registration error, i.e. the distance of two or more pattern elements 120 deviates from the position predetermined by the layout data. It is also possible that the error 190 may be a planarity error of the mask substrate 110, an overlay error, or an inhomogeneity of the optical transmission across the mask substrate 110 (not depicted in FIG. 1).

The portion of the substrate 110 of the photolithographic mask 100 carrying pattern elements 120 is called active area 170 of the mask 100, whereas the boundary portion which does not have pattern elements 120 is called non-active area 175. A laser beam having the actinic exposure or illumination wavelength illuminates the substrate 110 of the mask 100 through the second or rear surface 160 of the substrate 110.

The term "essentially" means in the context of this application the designation of a measured variable within its error margin when using state of the art metrology tools to measure the variable.

Figure 2:
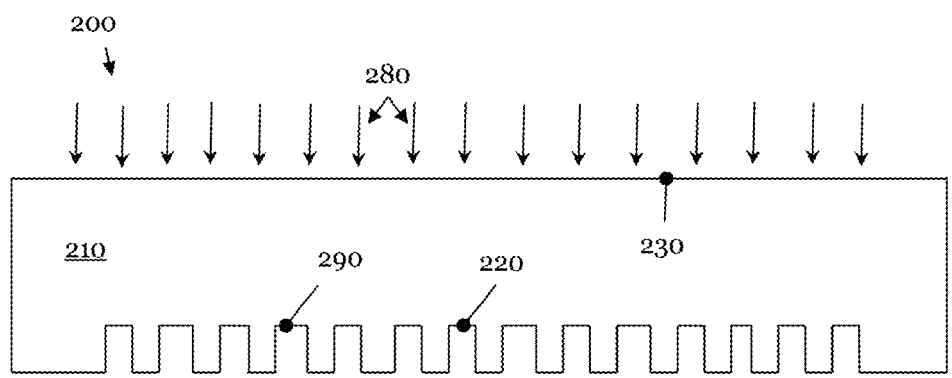
FIG. 2 schematically depicts a cross-sectional view of a template used in the nanoimprint lithography.

FIG. 2 schematically illustrates a template 200 used in the nanoimprint lithography to transfer pattern elements on a wafer. The template 200 comprises a material 210 which is transparent in the UV and DUV spectral range, often fused silica is used as a template material. The exemplary template 200 of FIG. 2 has an error 290. The pattern elements on the front template side 220 are fabricated in a process which is very similar to the fabrication of the pattern elements 120 of the photolithographic mask 100 of FIG. 1. Thus, the inventive principle can also be applied to correct various kinds of errors of a template 200 used in the nanoimprint lithography.

The template 200 is illuminated by electromagnetic radiation 280 through the template rear side 230.

Figure 3:
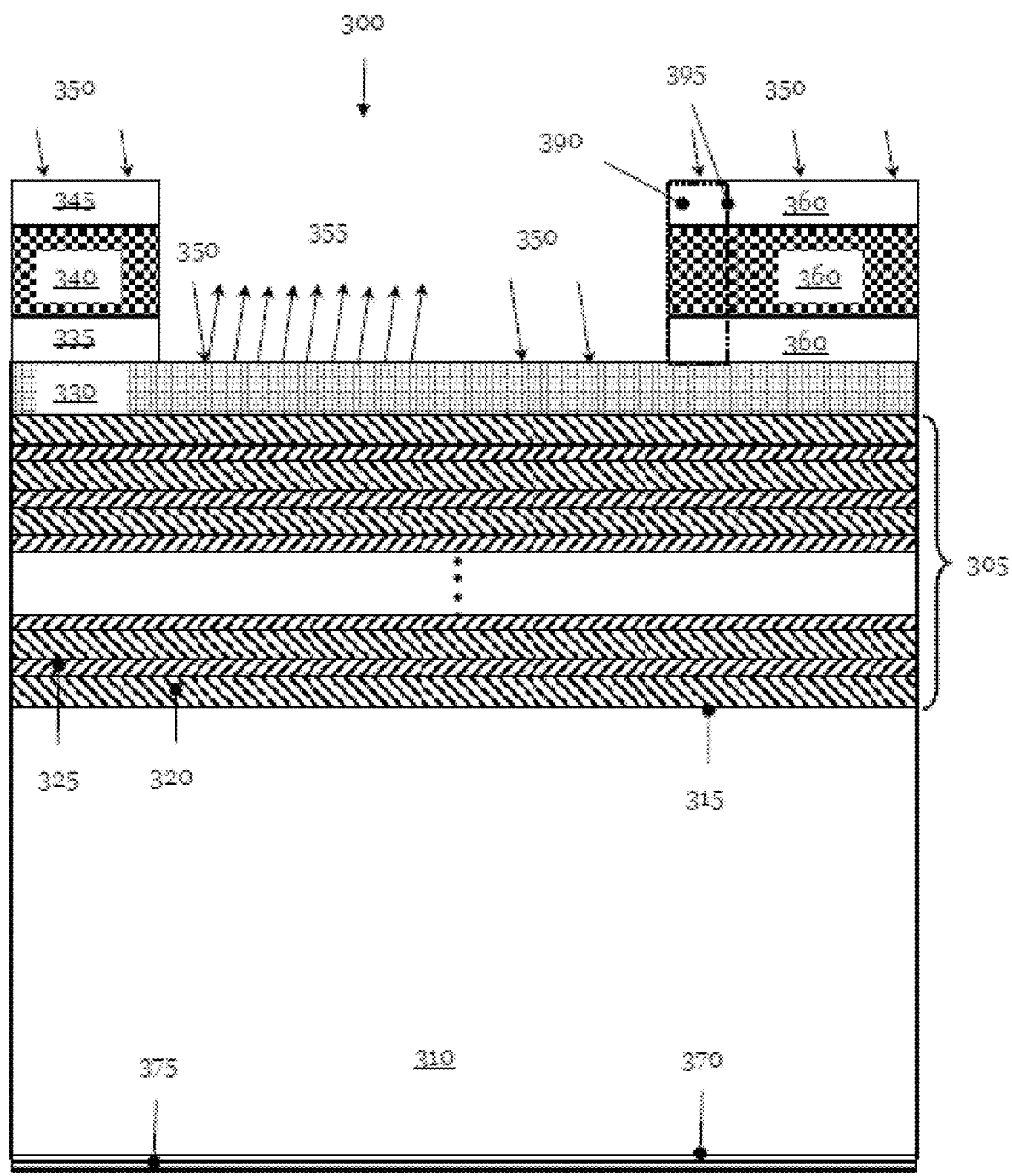
FIG. 3 schematically shows a cross-section of a of a reflective extreme ultraviolet (EUV) mask.

FIG. 3 shows a schematic cross-sectional view of a photolithographic mask 300 for an exposure wavelength of 13.5 nm. Different from the photolithographic mask of FIG. 1, the EUV mask 300 is a reflective optical element based on a multilayer structure 305. The multilayer structure 305 acts as a mirror which selectively reflects incident EUV photons 350. The multilayer structure 305 of the EUV mask 300 is deposited on a front substrate surface 315 of a suitable substrate 310, such as fused silica substrate. Other transparent dielectrics, glass materials or semiconducting materials can also be applied as substrates for photolithographic masks as for example ZERODUIR®, ULE® or CLEAR-CERAM®. It is advantageous that the material of the substrate 310 has a very low thermal expansion (LTE) coefficient.

The multilayer film or multilayer structure 305 comprises 20 to 60 pairs of alternating molybdenum (Mo) 320 and silicon (Si) layers 325. The thickness of each Mo layer 320 is 4.15 nm and that of the Si layer 325 amounts to 2.80 nm. To protect the multilayer structure 305, a capping layer 330 of silicon with a native oxide of 7 nm depth is arranged on top of the multilayer structure 305. Other materials can also be used for forming a capping layer 330 as for example ruthenium.

In the multilayer 305, the Mo layers 320 act as scattering layers, whereas the silicon layers 325 function as separation layers. Instead of Mo, other elements with a high Z number can be utilized for the scattering layers, such as cobalt (Co), nickel (Ni), tungsten (W), rhenium (Re) and iridium (Ir).

As already mentioned, the multilayer structure 305 on the substrate 310 of the EUV mask 300 acts as a mirror for EUV electromagnetic radiation. To become an EUV mask 300, a buffer structure 335 and an absorbing pattern structure 340 are additionally deposited on the capping layer 330. The buffer layer 335 can be deposited to protect the multilayer structure 305 during processing, for example during etching and/or repairing of the absorbing pattern structure 340. Possible buffer structure materials are for example fused silica ($SiO_2$), silicon-oxygen-nitride (SiON), ruthenium (Ru), chromium (Cr), and/or chromium nitride (CrN). The absorbing structure 340 comprises a material having a large absorption constant for photons in the EUV wavelength range. Examples of these materials are chromium (Cr), titanium nitride (TiN) and/or tantalum nitride (TaN).

An anti-reflective (AR) layer 345 can additionally be arranged on the absorbing pattern structure 340 to secure that no photons are reflected by the surface of the absorber pattern 340. Tantalum oxynitride (TaON) can be used for fabricating an AR layer. A thickness of about 50 nm is sufficient to essentially absorb all EUV photons 350 incident on the absorbing structure 340. In contrast, the majority of the photons 350 incident on the capping layer 330 is reflected as photons 355.

In the example of FIG. 3, the pattern element 360 has an error 390 in form of a registration error. The portion of the pattern element 360 indicated by the dotted line 395 should be free of absorbing material.

Similar to transmissive photomasks 110, the substrate 310 of the EUV mask 300 has normally lateral dimensions of 152 mm×152 mm and a thickness or height of essentially 6.35 mm. The rear surface 370 of the substrate 310 or the rear substrate surface 370 has a thin coating 375. The coating 375 should be electrically conductive so that the EUV mask 300 can be fixed by electrostatic forces, i.e. it can electronically be chucked on a sample stage of a lithographic illumination system. Further, the coating should be at least partially optically transparent around the wavelength which the laser system uses to introduce the pixel(s) into the substrate 310. Materials which fulfil both requirements are for example indium tin oxide (ITO), fluorine tin oxide (FTO), and/or antimony tin oxide (ATO). The coating 375 can have a thickness of 10 nm to 50 nm. Alternatively, the coating can comprise a chromium nitride (CrN) layer having a thickness of 10 nm to 20 nm. Further, it is also possible that the alternative coating comprises a CrN layer and a metal oxide layer having a thickness in a range of up to 600 nm.

In a further alternative, very thin metal layers can be used for the coating 375. For example, the coating 375 can comprise at least one metal of the group of: nickel (Ni), chromium (Cr), aluminum (Al), gold (Au), silver (Ag), copper (Cu), titanium (Ti), wolfram (W), indium (In), platinum (Pt), molybdenum (Mo), rhodium (Rh), and/or zinc (Zn) and/or mixtures of at least two of these metals. The thickness of the metal layer is typically smaller than 30 nm.

Figure 4:
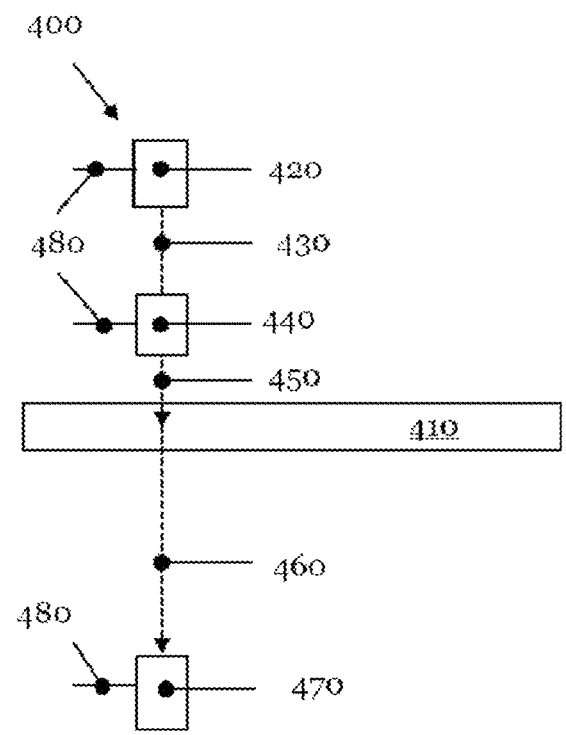
FIG. 4 schematically presents a block diagram of some components of an apparatus which can be used to determine a stress birefringence.

FIG. 4 presents a cross-section of an apparatus 400 which can be used to determine a stress birefringence induced by introducing pixel(s) in a substrate 110, 310 of a photolithographic mask 100, 300. The apparatus 400 comprises a light source 420, which can be a laser source 420. The light source can emit light in the visible range of the electromagnetic spectrum. For example, in FIG. 4 a HeNe (Helium Neon) laser is used as a light source. The light beam 430 generated by the light source 420 passes through a photo-elastic modulator (PEM) 440. The PEM 440 comprises a polarizer at its entrance (not shown in FIG. 4) and typically a piezo-electric transducer which periodically compresses and expands an optical medium which is often a quartz glass plate. Normally, the modulation frequency is 50 kHz. Thus, the photo-elastic modulator 440 modulates a polarization of the light beam leaving the polarizer.

The modulated light beam 450 transmits a sample 410. The sample 410 can be a mask substrate 110, 310 of a photolithographic mask 100, 300 or can be a template 200 applied to the nanoimprint lithography. As discussed in the context of FIGS. 1 and 3, the substrate of a photolithographic mask is typically an optically isotropic material. But, stress can be induced into mask substrate 110, 310 by the mask fabrication process, i.e. by the fabrication of the pattern 130 for a transmissive mask 100 or by the fabrication of the pattern elements 360 on the front side 315 and/or the coating 375 on the rear surface 370 for a reflective mask 300. Thus, a substrate 110, 310 which is free of defects can have an induced stress after a photolithographic mask 100, 300 is fabricated based on the substrate 110, 310. Consequently, a photolithographic mask 100, 300 can show a stress birefringence. To eliminate this stress birefringence contribution, the measurements of the stress birefringence are difference measurements, i.e. the stress birefringence is measured prior to and after the introduction of the pixel(s) into the mask substrate 110, 310.

Further, for example, stress can temporarily be applied to a photolithographic mask 100, 300 by an inappropriate fixing of the mask 100, 300. This temporal stress caused by an inappropriate handling of a photomask 100, 300 is not considered in the present application.

The introduction of pixel(s) into the substrate 100, 310 of a mask 100, 300 induces a local permanent stress into the mask substrate 100, 300 in a defined manner. It is known that an induced stress causes or induces a change in the impermeability $\Delta\beta_{ij}$ which linearly depends on the stress induced in the material of the mask substrate 100, 300, wherein the impermeability $\beta$ and the permittivity $\varepsilon$ are linked by:

$$\varepsilon = \frac{1}{\beta}. \tag{1}$$

This dependence can be expressed with the aid of the components of the stress optic matrix:

$$\Delta\beta_{ij} = \sum_{k=1,l=1}^{3,3} q_{ijkl}\sigma_{kl}, \tag{2}$$

wherein q is the stress optical coefficient matrix, and σ is the stress tensor. Therefore, the stress induced in the material of the mask substrate 110, 310 by introducing or writing pixel(s) into the substrate 110, 310 is directly linked to the retardation Δ of an optical beam in the material of the substrate 110, 310 and is given by the equation:

$$\Delta = d \cdot n_0^3 \cdot \sqrt{\left(\frac{\beta_{11} - \beta_{22}}{2}\right)^2 + \beta_{12}^2} \tag{3}$$

where d is the thickness of the mask substrate 110, 310, $n_0$ is the refractive index of the isotropic material of the substrate 110, 310 and $\beta_{ij}$ are the components of the impermeability matrix of the substrate material of the photomask 100, 300. Equation 3 describes the retardation in a two-dimensional deformation model in the plane of a photolithographic mask 100, 300.

The retardation Δ caused by the stress birefringence resulting from the introduction of pixel(s) into a mask substrate 110, 310 is connected in a simple manner to precisely measurable quantities. The retardation Δ of a photolithographic mask 100, 300 having a material birefringence is determined by the thickness d of the substrate 110, 310 of the mask 100, 300 and the refractive indices of its fast $n_F$ and slow axis $n_S$ of the substrate 110, 310 according to the equation:

$$\Delta = d \cdot (n_S - n_F) = d \cdot \Delta n = d \cdot \delta \tag{4}$$

where δ is called birefringence. The dimension of the retardation is meter; typically, it is indicated in nanometer.

The retardation Δ caused by the material birefringence of the mask substrate 110, 310 results in a variation of the polarization of the laser beam 460 leaving the sample 410 with respect to the polarization of the incident laser beam 450.

The light beam 460 leaving the sample 410 enters a detection system 470. The detection system 470 can contain a beam splitting mirror which separates the modulated light beam 460 in two beams having essentially the same optical intensity. Each partial beam passes a combination of an analyzer and a filter and is then detected by a photodetector. The components inside the detection system 470 are not indicated in FIG. 4.

The lateral resolution of the apparatus 400 is determined by the focal width of the modulated laser beam 450 in the sample 410. Presently, the lateral resolution for the determination of the stress birefringence is in the range of 4 μm.

A computing unit (not shown in FIG. 4) can convert the measuring signals of the two photodetectors into parameters from which the birefringence of the sample 410 can be determined. The apparatus 400 or the computing unit provides as output signals the retardation Δ and the fast axis angle. Typically, the resolution limit of the apparatus 400 is in the range of some picometer. A resolution down to 1 pm is possible, typically the repeatability in about ±10 pm.

The light source 420, the PEM 440, and the detection system 470 of the apparatus 400 can have interfaces 480. The apparatus 400 can output the data of the computing unit via the interface 480. It is also possible that the apparatus 400 can externally be controlled via the interface 480 and transmits its measured data to an external computer system by use of the interface 480.

The apparatus 400 of FIG. 4 determines a stress birefringence induced by introducing pixel(s) in a substrate 110, 310 of a photolithographic mask 100, 300 by transmitting light through the substrate 110, 310. But, it is also possible determining a stress birefringence by using an apparatus which exclusively operates on the basis of light reflected from the substrate 110, 310 (not shown in FIG. 4). Thus, an apparatus can be used for analyzing stress birefringence of EUV masks 300.

Figure 5:
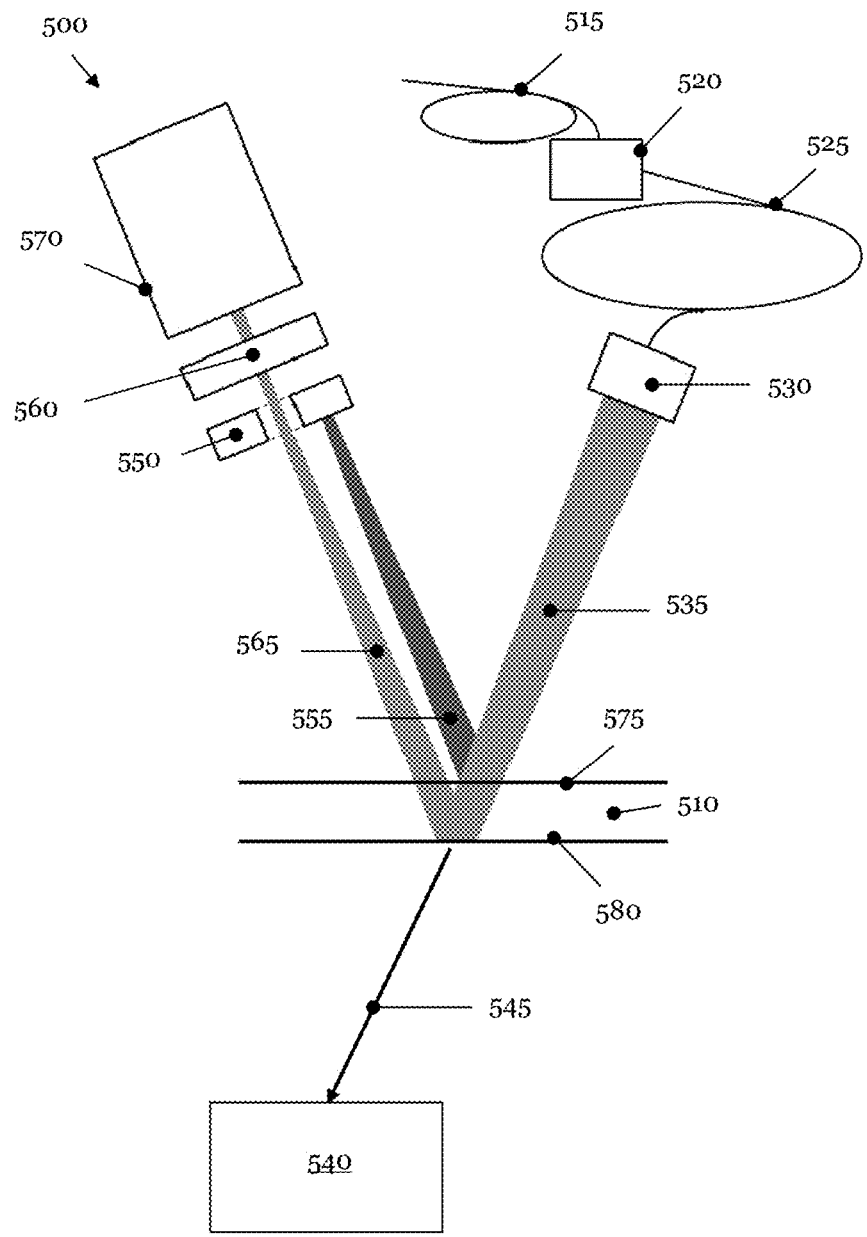
FIG. 5 shows some components of an optical measurement system that allows to measure the optical reflection and the optical transmission of a sample.

FIG. 5 schematically presents some components of an optical measurement system 500 which can be used to determine the optical absorption of a mask substrate 100, 300, in particular the substrate 310 of the EUV mask 300. The optical measurement system 500 comprises a light source 520 which can be a laser system. The wavelength of the light source 520 can be adapted to the wavelength of the laser system which is used to introduce the pixel(s) into the mask substrate 110, 310. In the examples of FIG. 5, the light source is a light emitting diode (LED). By use of the cable 515 the light source 520 is connected to a controlling unit (not depicted in FIG. 5). The light generated by the light source 520 is connected via the optical fiber 525 to a projection system 530 which directs the light beam 535 onto a sample 510. The sample 510 can be a photolithographic mask 100, 300 or can be a template 200.

A first typically small portion of the incident light beam 535 is reflected at the front side of the sample 510. For example, the front side 575 of the sample 510 can be the rear side 160 of the substrate 110 of the transmissive mask 100 or can be the surface of the front side of the coating 375 of the substrate 310 of the photolithographic mask 300. A second portion of the light beam 535 is reflected from the rear side 580 of the sample 510. The rear side 580 of the sample 510 can be the front side 190 of the substrate 110 of the transmissive mask 100 or can be the front side 315 of the substrate 310 of the EUV mask 300.

The first reflected portion 555 and the second reflected portion 565 can be separated by an aperture 550, for example by a pinhole 550. Further, the beam transmitting the aperture 550 is filtered by a filter 560 and is then measured by the photodetector 570. Thus, the first reflected portion 555 and the second reflected portion 565 can be measured sequentially by the photodetector 570. It is also possible to use two different photodetectors 570 to simultaneously detect the first 555 and the second 565 reflected portion.

A second photodetector 540 is arranged behind the sample 510 which detects the portion 545 of the incident light 535 that transmits the sample 510 and is not reflected at the rear side 580 of the sample 510. The photodetector 540, 570 can comprise a photodiode, for example a PIN diode or an avalanche diode. Alternatively, a photomultiplier can be used as a photodetector 540, 570.

The lateral resolution of the detection of the reflected 555, 565 and the transmitted radiation depends on the focal width of the incident light beam 535 which is determined by the projection system 530 and the apertures 550 of the photodetectors 540 and 570. The lateral resolution of the optical measurement system 500 is in the range of 100 µm to 1 mm. A higher lateral resolution can be obtained at the expense of the signal-to-noise ratio of the signals of the photodetectors 540, 570 when using apertures 550 having smaller openings.

Based on the measurements of the photodetectors 540 and 570, the reflected portion 555, 565 and the transmitted portion 545 of the light beam 535 incident on the sample 510 can be determined. Based on these measurements, the absorption or the attenuation of the substrate 110, 310 can be calculated. Further, the data measured by the photodetectors 540, 570 also enables to determine absorption of the coating layer 375 of the EUV mask 300. Moreover, the photodetectors 540, 570 can measure the reflected portion 555, 565 and the transmitted portion 545 of the incident light beam 535 as a function of a lateral position of the mask substrate 110, 310. Therefore, the measurement system 500 allows determining the absorption or the attenuation of both the substrate 110, 310 and/or the coating 375 with a high spatial resolution.

Figure 6:
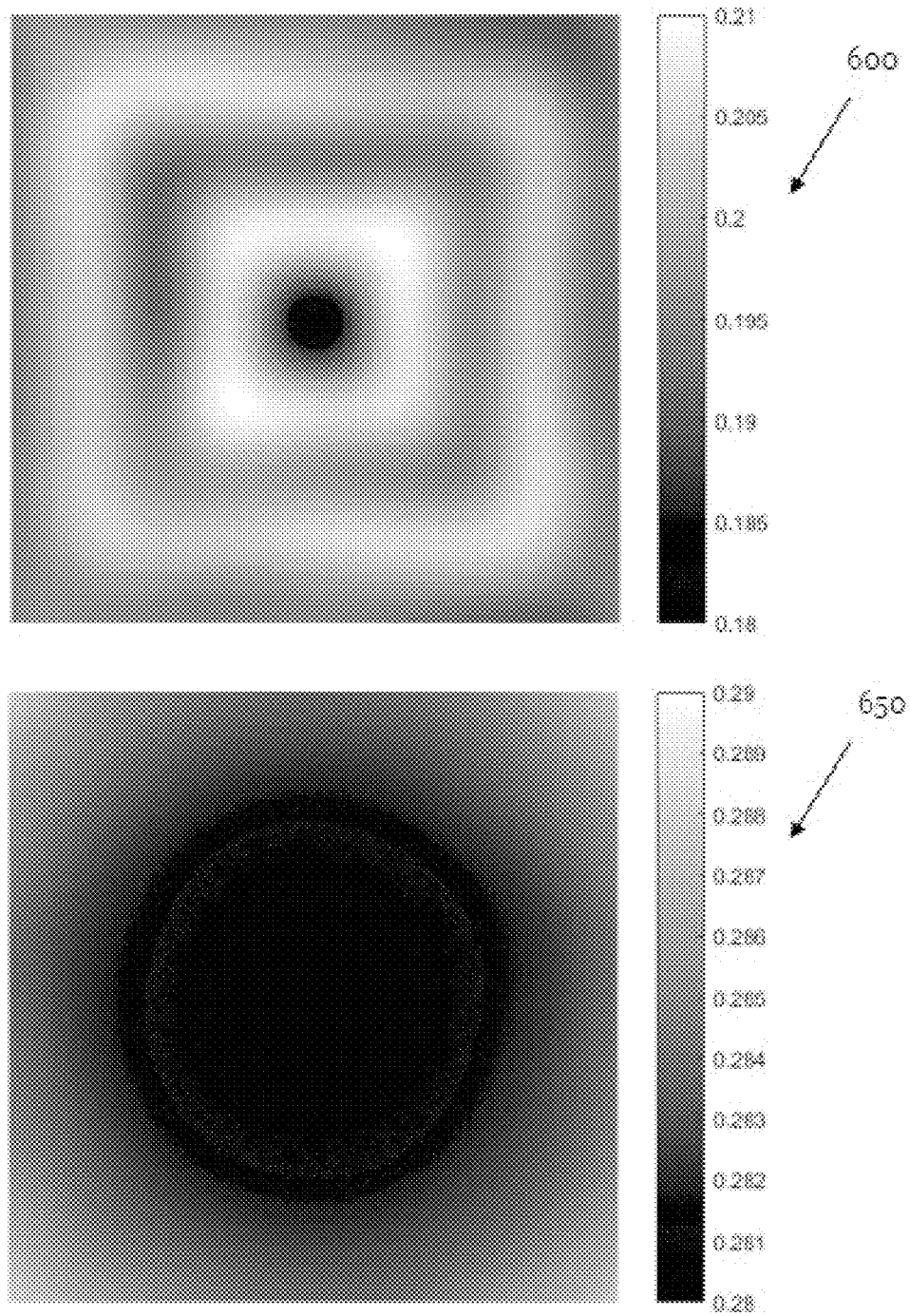
FIG. 6 the upper image presents a variation of the transmission of a mask substrate of an EUV mask across the substrate and the lower image depicts a variation of the reflection of a coating on the rear of a substrate of a reflective mask, both images are determined with the optical measurement system of FIG. 5.

The upper image 600 of FIG. 6 presents the variation of the transmitted portion 545 of the incident light beam 535 across the photolithographic mask 300 as a function of the lateral position. The light source 520 has a wavelength of 532 nm. As can be taken from image 600, the absolute transmission variation is approximately 3% across the photomask 300.

The lower image 650 of FIG. 6 depicts the variation of the first reflected portion 555 of the incident light beam 535 across the coating 375 of the substrate 300 of the EUV mask 300 again for a wavelength of the incident light beam 535 of 532 nm. The maximum absolute variation amounts to about 0.7%.

The person skilled in the art will recognize that the images 600 and 650 show absolute numerical values of the light beams transmitted 545 and reflected 555 across the substrate 310 of the EUV mask 330. This means that the substrate 310 and the coating 375 of the EUV mask 300 transmit approximately 20% of the incident light beam 535 in the example presented in FIG. 6. The light 555 reflected in the first order from the front side 575 of the sample 510 amounts approximately 29% in the example of FIG. 6. Thus, according to A=1−R−T, about 50% of the incident light 535 is absorbed in the substrate 310 and the coating 375 of the EUV mask 300 in the example of FIG. 6. Typical first order reflection values are in a range of 30% to 60%. Further, typically 15% to 25% of the incident light 535 are transmitted through the substrate 310 and the coating 375 of an EUV mask 300. Therefore, in the example of FIG. 6, the absorption of the substrate 310 and the coating 375 of EUV masks comprise a range of 15% to 55%. However, as already mentioned, this is just an example. There are other coatings and substrates which may have no significant absorption, or which can have higher or lower optical transmissions or can have higher and lower numerical reflectivity values than indicated in the example of FIG. 6.

Figure 7:
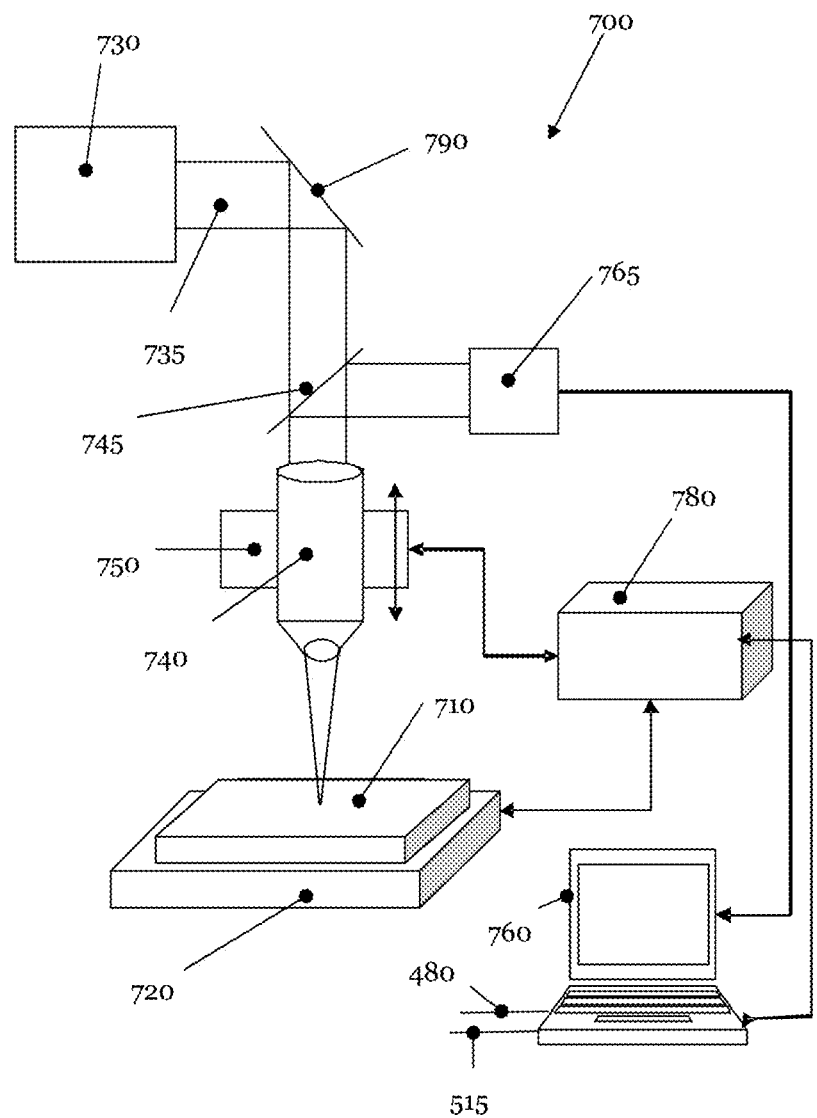
FIG. 7 schematically shows a cross-section of some components of a pixel writing system.

FIG. 7 depicts a schematic block diagram of an exemplary pixel writing apparatus 700 which can be used to correct errors of the photolithographic masks 100, 300 of FIGS. 1 and 3 as well as the templates 200 of FIG. 2. The pixel writing apparatus 700 comprises a chuck 820 which can be movable in three dimensions. The sample 710 can be fixed to the chuck 720 by using various techniques as for example clamping. The sample 710 is mounted upside down to the chuck 720 so that its rear substrate surface is directed towards the objective 740. The sample 710 can be the photolithographic mask 100, 300, or can be the template 200.

The pixel writing apparatus 700 includes a pulse laser source 730 which produces a beam or a light beam 735 of pulses or light pulses. The laser source 730 generates light pulses of variable duration. The pulse duration can be as low as 10 fs (femtosecond) but can also be continuously increased up to 100 ps (picosecond). The pulse energy of the light pulses generated by the pulsed laser source 730 can also be adjusted across a huge range reaching from 0.01 µJ per pulse up to 10 mJ per pulse. Further, the repetition rate of the light pulses comprises the range from 1 Hz to 100 MHz. For example, the light pulses can be generated by a Ti:Sapphire laser operating at a wavelength of 800 nm. However, the error correction method by introducing of pixel(s) into a mask substrate 110, 310 is not limited to this laser type, principally all laser types can be used having a photon energy which is smaller than the band gap to the substrate 110, 310 of the photolithographic mask 100, 300 or the template 200 and which are able to generate pulses with durations in the femtosecond range. Therefore, for example, Nd-YAG laser or dye laser systems can also be applied (not shown in FIG. 7).

The steering mirror 790 directs the pulsed laser beam 735 into the focusing objective 740. The objective 740 focuses the pulsed laser beam 735 through the rear substrate surface 160, 370 into the substrate 110, 310 of the photolithographic mask 100 300. The NA (numerical aperture) of the applied objectives 740 depends on the predetermined spot size of the focal point and the position of the focal point within the substrate 110, 310 of the photolithographic mask 100, 300 relative to the rear substrate surface 160, 370. The NA of the objective 840 can be up to 0.9 which results in a focal point spot diameter of essentially 1 µm and a maximum intensity of essentially $10^{20}$ W/cm$^2$.

The pixel writing apparatus 700 also includes a controller 780 and a computer system 760 which manage the translations of the two-axis positioning stage of the sample holder 720 in the plane of the sample 710 (x- and y-directions). The controller 780 and the computer system 760 also control the translation of the objective 740 perpendicular to the plane of the chuck 720 (z-direction) via the one-axis positioning stage 750 to which the objective 740 is fixed. It should be noted that in other embodiments of the pixel writing apparatus 700, the chuck 720 can be equipped with a three-axis positioning system to move the sample 710 to the target location and the objective 740 can be fixed, or the chuck 520 can be fixed and the objective 540 can be moveable in three dimensions.

The computer system 760 can be a microprocessor, a general-purpose processor, a special purpose processor, a CPU (central processing unit), or the like. It can be arranged in the controller 780, or can be a separate unit such as a PC (personal computer), a workstation, a mainframe, etc. The computer system 760 can further comprise an interface which connects the computer system 760 to the apparatus 400 of FIG. 4 via the connection 755. Further, the computer system 760 can control the laser source 520 via the connection 515 and the photodetectors 540 and 570 of the optical measurement system 500 of FIG. 5 by use of the connection 795.

Further, the pixel writing apparatus 700 can also provide a viewing system including a CCD (charge-coupled device) camera 865 which receives light from an illumination source arranged in the chuck 720 via the dichroic mirror 745. The viewing system facilitates navigation of the sample 710 to the target position. Further, the viewing system can also be used to observe the formation of a modified area on the rear substrate surface of the sample 710 by the pulse laser beam 735 of the light source 730.

The computer system 760 can comprise a processing unit which determines the laser beam parameters of the laser beam 735 from error data and measurement data obtained from the apparatus 400 via the interface 480 and the measurement system 500 by use of the interface 515. By considering the experimental data of both the apparatus 400 and the measurement system 500, the one of more errors of the photolithographic masks 100, 300 can effectively be corrected without having the risk that the error correction process causes a new defect of the photomask 100, 300. Further details of a pixel writing process are described in the U.S. Pat. No. 9,658,527 B2.

Figure 8:
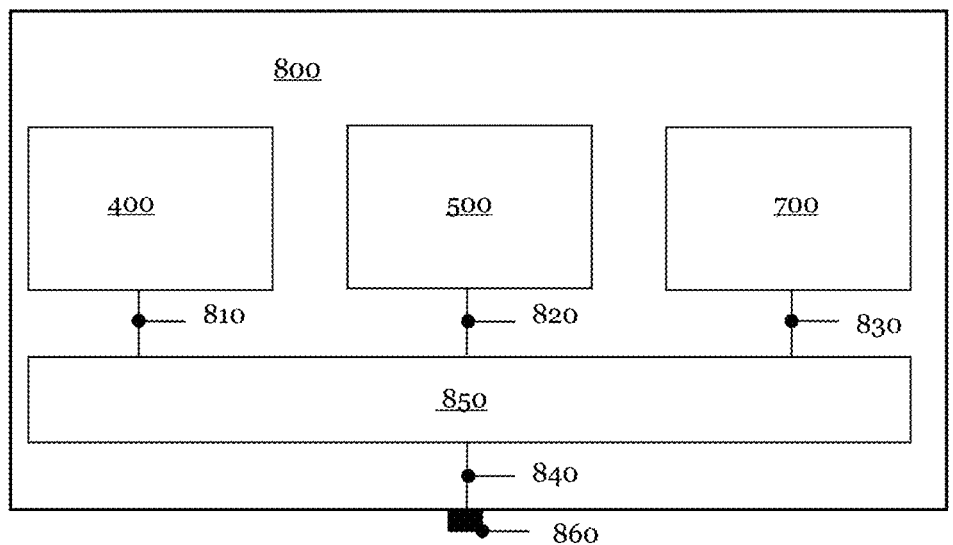
FIG. 8 schematically represents a cross-section of an apparatus combining the apparatus of FIG. 4, the optical measurement system of FIG. 5, and pixel writing system of FIG. 7.

FIG. 8 schematically depicts a cross-section of a combined apparatus 800 which combines the apparatus 400 of FIG. 4, the optical measurement system 500 of FIG. 5 and the pixel writing apparatus 700 of FIG. 7 in a single device. A control and processing unit 850 controls the apparatus 400 via the connection 810, the measurement system 500 by use of the connection 820, and the pixel writing apparatus by use of the connection 830. Further, the control and processing unit 850 is connected to an external interface 860 via the connection 840.

The control and processing unit 850 controls the measurement of the stress birefringence by the apparatus 400 and obtains the experimental data from the apparatus 400 via the connection 810. Furthermore, the control and processing unit controls the measurement of the optical reflection and the optical transmission of the substrate 310 and/or the coating 375 and receives the measured data. For example, based on these data, the control and processing unit 850 can determine the power of a laser beam 735 incident on the coating 375 of the mask substrate 110, 310 as a function of the depth within the substrate 310. As the correcting effect of a pixel strongly depends on the local energy density at the location where a pixel is generated, the error correction process of the pixel writing apparatus can precisely be controlled by the pixel writing apparatus 700.

The control and processing unit 850 can receive error data of the mask 100, 300 from a defect metrology system via the interface 860 and the connection 840. Based on the obtained error data, the determined stress birefringence of the substrate 110, 310 and the determined reflection and transmission characteristics of the substrate 110, 310, the control and processing unit 850 can determine the laser beam parameters of the pixel writing apparatus 700. The control and processing unit 850 can be implemented in hardware, software, firmware, and a combination thereof. The control and processing unit 850 can comprise an algorithm that calculates the parameters of the laser beam 735 of the laser system 730 of the pixel writing apparatus 700 from the measured data received from the apparatus 400 and the optical measurement system 500.

Figure 9:
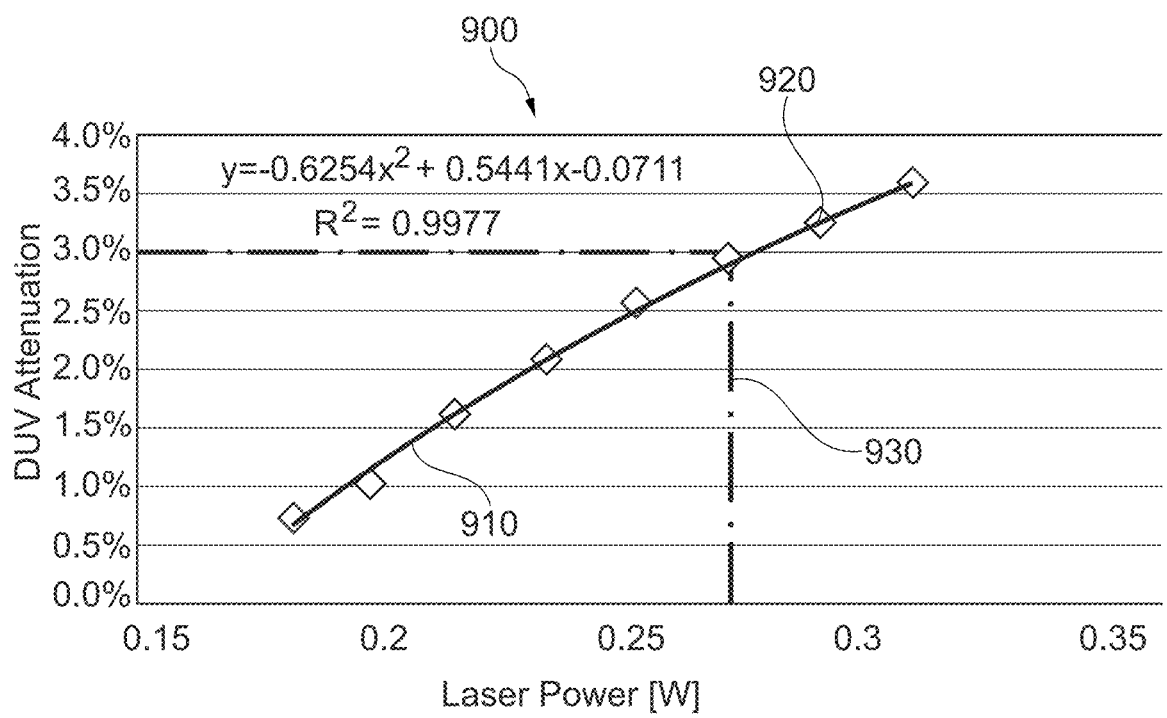
FIG. 9 presents the optical transmission variation at the actinic wavelength caused by the introduction of pixels into a substrate of a photolithographic mask as a function of the laser power of the laser system used for writing the pixels into the substrate.

The diagram 900 of FIG. 9 presents a measurement of the optical transmission variation of the substrate 110 of the photolithographic mask 100 into which a plurality of pixel arrangements has been introduced. In FIG. 9 and the following FIG. 10, the pixels within each of the plurality of pixel arrangements have a constant density. In the example of FIG. 9, the lateral dimensions of the pixel arrangements are 3 mm×3 mm and the pixels have a pitch of about 4 µm in both directions. All pixel arrangements have been written in the center of the substrate 110, i.e. in a depth of 3.175 mm. The various pixel arrangements have been introduced into the substrate 110 with different power levels of the laser system 730 of the pixel writing apparatus 700. The laser beam parameters used for introducing the pixel arrangements into the mask substrate 110 are indicated in the following table.

TABLE 1

Numerical values of selected laser beam parameters

| Parameter | Numerical value | Unit |
|---|---|---|
| Pulse energy (at mask level) | 0.05-0.5 | μJ |
| Pulse length | 0.5-50 | ps |
| Pulse density | 10 000-100 000 | mm$^{-2}$ |
| NA | 0.3 | |
| Wavelength | 532 | nm |

For obtaining the measurement points indicated in FIG. 9, the substrate 110 having the pixel arrangements has been illuminated in CW (Continuous Wave) mode with a DUV (Deep UltraViolet) lamp. The radiation of the DUV has been filtered with a narrowband filter. Alternatively, the measurement data of FIG. 9 can also be measured at the actinic wavelength of the mask 100, i.e. at 193 nm. Thus, the light source of a photolithographic illumination system can be used for this measurement. Typically, the light source of the photolithographic illumination system radiates the substrate 110 in CW mode or quasi CW mode.

As can be seen from the diagram 900, the attenuation of the optical radiation in the deep ultraviolet (DUV) wavelength range almost linearly increases as a function of the laser power used in the pixel writing process. The details of the curve 910 fitted to the measurement points 920 are indicated in FIG. 9. Based on the curve 910, a look-up table can be established which can be used for the determination of second pixel arrangements containing a second type of pixel which compensates the variation of the optical transmission or the DUV attenuation across the substrate 110 of the photomask 100. Based on the look-up table, the laser beam parameters of the laser system 730 can be fixed for writing the second type of pixel arrangements having at least one second type of pixel for compensating the variation of the optical transmission of the photolithographic mask 100.

In the example depicted in FIG. 9, there is a maximum for the tolerable optical attenuation of the mask substrate 110 of 3%. This amount of optical attenuation of the substrate 110 can be compensated by a scanner or a stepper which uses the corrected photolithographic mask 100 to project the pattern 130 of the mask 100 onto a photoresist arranged on a wafer. Thus, the maximum of tolerable optical attenuation fixes the maximum power of the laser beam 735 during a pixel writing process which corrects, for example, the error 190 of the photolithographic mask 100. The dash-dotted curve 930 illustrates this relation.

FIG. 9 describes the conventional calibration process for a defect correction process or a RegC process which introduces pixel(s) into a substrate 110 of a photolithographic mask 100. As already explained above, this calibration procedure can no longer be used for EUV masks 300. The substrate 310 of EUV masks 300 is not transparent for the actinic wavelength. Further, the conventional calibration process indirectly deduces the effect of the pixels introduced into the mask substrate 110 from the induced variation of the optical transmission of the substrate 110. Moreover, the optical transmission is not a relevant parameter for an EUV mask 300. It does not have to be maintained at a constant level, but can be chosen freely.

Figure 10:
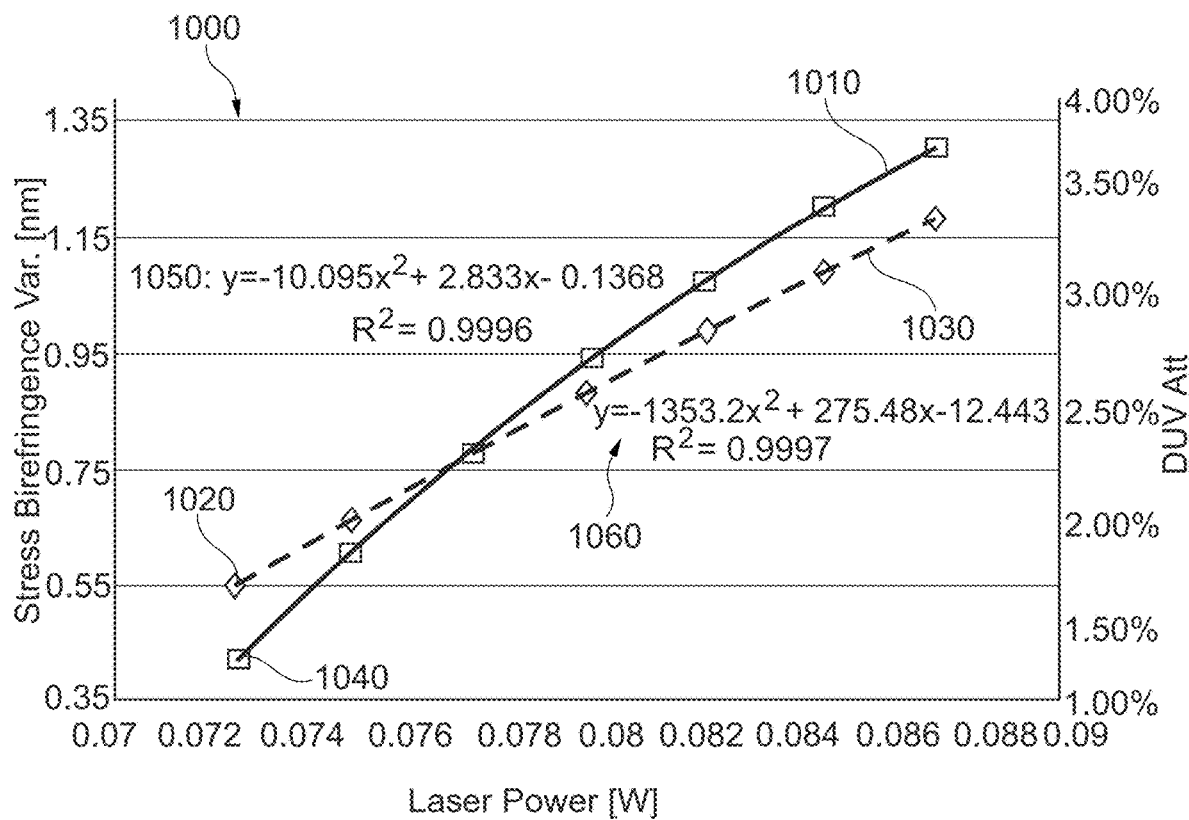
FIG. 10 depicts the optical transmission variation at the actinic wavelength and the stress birefringence caused by the introduction of pixels into a substrate of a photolithographic mask as a function of the laser power of the laser system used for writing the pixels into the substrate.

FIG. 10 shows again the optical transmission variation or the optical attenuation of pixel arrangements which are written into the mask substrate 110 with different power levels of the laser beam 735 of the pixel writing system 700. In FIG. 10 the pixel arrangements are written in a bare mask substrate 110. The measurement points 1020 are indicated by rotated squares. For the measurement points 1020 the ordinate is given on the right side of the diagram 1000. The fitted curve 1010 is given by the equation 1050.

FIG. 10 also presents stress birefringence measurements for the same pixel arrangements in the bare mask substrate 110. The measurement points 1040 are depicted by squares in FIG. 10. The results of the fitted curve 1030 are given by 1060 in the diagram 1000. The stress birefringence measurements presented in FIG. 10 are difference measurements. This means, the stress birefringence of the substrate 110 has been measured prior to the introduction the pixel arrangements into the mask substrate 110. Thus, the effect of a stress birefringence which may already exist in the substrate 110 prior the introduction of pixel arrangements is excluded from the data presented in FIG. 10.

The diagram 1000 clearly shows that pixel arrangements induce a stress birefringence. Further, FIG. 10 also reveals that the stress birefringence varies as a function of the laser power with which the pixels arrangements have been introduced into the substrate 110. Moreover, the measurement points 1120 and 1040 as well as the calculated curves 1010 and 1030 show that there is a correlation between the stress birefringence variation and the attenuation of the optical radiation in the DUV wavelength range.

Figure 11:
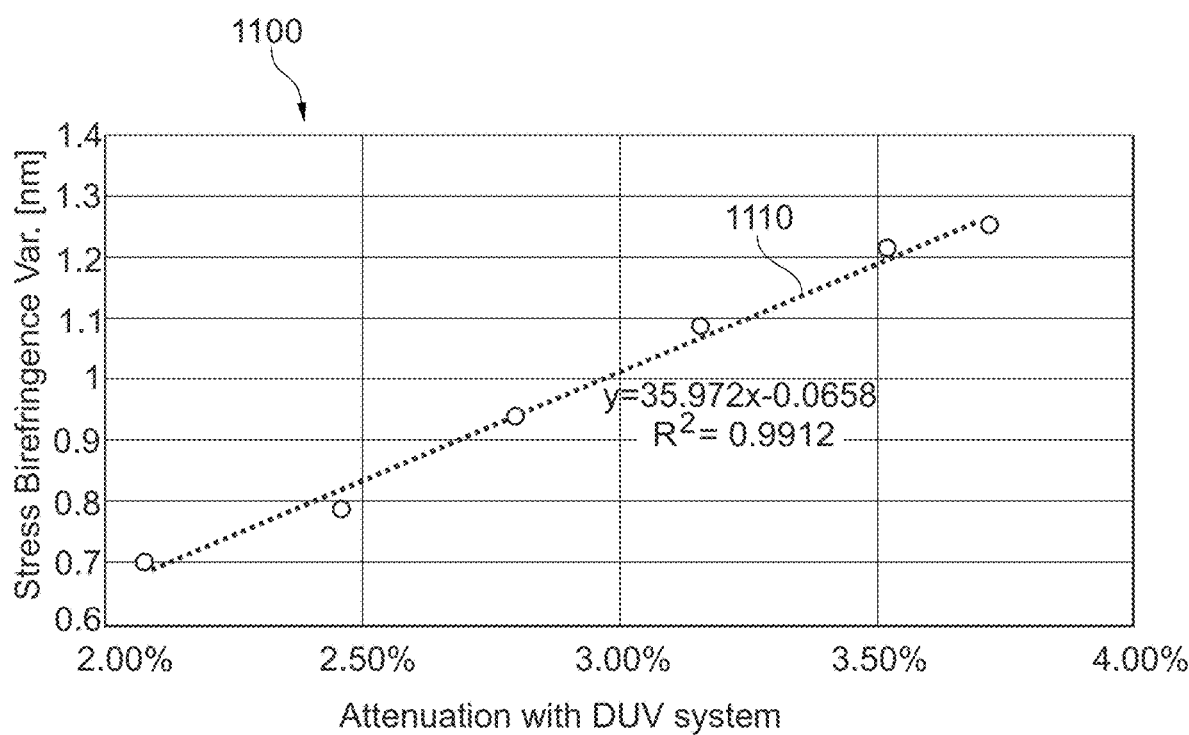
FIG. 11 shows a representation of the stress birefringence (ordinate) across the optical transmission variation (abscissa) for various laser powers used for the introduction of pixels into a mask substrate.

FIG. 11 presents a representation in which the optical attenuation data of FIG. 10 is represented on the abscissa and the stress birefringence data of FIG. 10 is presented on the ordinate for various levels of the laser power used for writing the pixel arrangements into the substrate 110. As can be clearly seen from the curve 1110, there is a linear relation between the optical attenuation and the stress birefringence caused by pixel arrangements which have been written with laser beams 835 having different power levels.

Thus, the diagram 1100 of FIG. 11 verifies that a stress birefringence measurement can be used for the calibration of RegC processes for transmissive photolithographic masks 100. The determination of stress birefringence can be used in addition to the conventional calibration process. However, a RegC calibration process based on a stress birefringence determination can also replace the present calibration approach based on the measurement of the optical attenuation caused by the pixels written into the substrate 110.

Even more important, as indicated in FIG. 4, the apparatus 400 uses a HeNe laser source as light source 420 so that the stress birefringence is measured at a wavelength of 632 nm. Therefore, the measurement of the stress birefringence can also be performed for the substrate 310 of the EUV mask 300 that is typically optically transparent in the visible wavelength range. By de-coupling the RegC calibration from the actinic wavelength, the method described in the present application can be used for both, transmissive 100 and reflective photolithographic masks 300.

Figure 12:
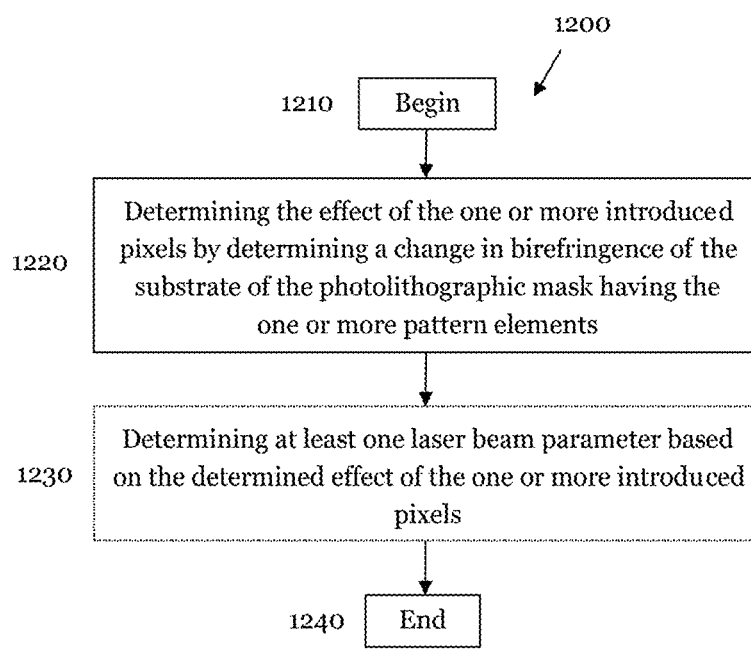
FIG. 12 presents a flow chart of the inventive method of the present application.

Finally, FIG. 12 shows a flow chart 1200 of the inventive method. The method begins at 1210. At step 1220 the effect of the one or more introduced pixels is determined by determining a change in birefringence of the substrate 110, 310 of a photolithographic mask 100, 300 having one or more pattern elements 120, 360. This step can be performed by an apparatus 400 which is designed for executing stress birefringence measurements.

At step 1230 at least one laser beam parameter is determined based on the determined effect of the one or more introduced pixels. Step 1230 is an optional step of the inventive method. This is indicated by a dotted frame in the flow chart 1200. The method ends at step 1240.

What is claimed is:

1. A method for determining an effect of one or more pixels to be introduced into a substrate of a photolithographic mask for at least partly correcting one or more errors of the photolithographic mask, the photolithographic mask having one or more pattern elements, wherein one or more calibration pixels serve to determine a calibration curve which can be used for controlling a pixel writing which at least partly corrects the one or more errors of the photolithographic mask, the method comprising:
    determining the effect of the one or more calibration pixels by determining a change in birefringence of the substrate of the photolithographic mask having the one or more pattern elements, wherein determining the change in the birefringence comprises using a transmissive optical birefringence measurement system using a wavelength which is larger than an actinic wavelength of the photolithographic mask, the actinic wavelength being the wavelength the photolithographic mask is designed for illuminating a photoresist on a wafer;
    establishing the calibration curve by using the determined change in birefringence of the substrate; and
    controlling the pixel writing process for at least partly correcting the one or more errors of the photolithographic mask based on the calibration curve.

2. The method of claim 1, wherein determining the effect of the one or more calibration pixels comprises determining the change in the birefringence as a function of at least one laser beam parameter of a laser system used for introducing the one or more calibration pixels into the substrate of the photolithographic mask.

3. The method of claim 2, further comprising the step of controlling the at least one laser beam parameter of the laser system based on the determined change in birefringence when writing the one or more pixels into the substrate of the photolithographic mask in order to correct the one or more errors of the photolithographic mask.

4. The method of claim 2, wherein the at least one laser beam parameter comprises at least one of: a power of the laser beam, a pulse length, a pulse density, a focus width, a focus depth, a wavelength, a wave front, or a polarization of the laser beam.

5. The method of claim 2, further comprising the step of determining an optical transmission variation of the substrate as a function of the at least one laser beam parameter.

6. The method of claim 2, further comprising the step of: linking the change in birefringence with an optical transmission variation caused by the one or more calibration pixels introduced into the substrate, the at least one laser beam parameter being a parameter.

7. The method of claim 3, wherein controlling the at least one laser beam parameter comprises limiting a numerical value of the at least one laser beam parameter so that introducing the one or more pixels into the substrate does not locally exceed a predetermined threshold of the variation of the optical transmission of the substrate of the photolithographic mask.

8. The method of claim 2, further comprising a step of determining the optical transmission variation of the substrate at the wavelength used by the laser system for introducing the one or more pixels into the substrate.

9. The method of claim 1, further comprising a step of determining the optical transmission variation as a function of a depth and/or a lateral position of the substrate where the one or more pixels are to be introduced into the substrate.

10. The method of claim 1, wherein the substrate has a coating on a rear surface of the substrate, the coating being electrically conductive and at least partially optically transmissive at the wavelength at which the one or more pixels are to be introduced into the substrate.

11. The method of claim 10, further comprising a step of determining the optical transmission variation of the substrate and/or the coating at the wavelength used by the laser system for introducing the one or more pixels into the substrate.

12. The method of claim 11, wherein determining the optical transmission variation of the substrate and/or the coating comprises determining a variation of the optical transmission as a function of a lateral position of the substrate of the photolithographic mask.

13. The method of claim 11, further comprising the step of determining the optical transmission variation of the substrate and the coating as a function of the depth and/or the lateral position of the substrate where the one or more pixels are to be introduced into the substrate.

14. The method of claim 11, further comprising the step of determining the optical transmission variation of the substrate and/or the coating as a function of the depth of the substrate where the one or more pixels are to be introduced into the substrate.

15. A method for determining an effect of one or more pixels to be introduced into a substrate of a photolithographic mask for at least partly correcting one or more errors of the photolithographic mask, the photolithographic mask having one or more pattern elements, wherein one or more calibration pixels serve to determine at least one of a fitted curve or a look-up table that can be used for controlling a pixel writing which at least partly corrects the one or more errors of the photolithographic mask, the method comprising:
    determining the effect of the one or more calibration pixels by determining a change in birefringence of the substrate of the photolithographic mask having the one or more pattern elements, wherein determining the effect of the one or more calibration pixels comprises determining the change in the birefringence of the substrate as a function of a power of a laser beam of a laser system used for introducing the one or more calibration pixels into the substrate of the photolithographic mask, wherein the laser system has a wavelength that is larger than an actinic wavelength of the photolithographic mask, the actinic wavelength being the wavelength the photolithographic mask is designed for illuminating a photoresist on a wafer;
    determining at least one of the fitted curve or the look-up table having information about a relationship between the change in the birefringence of the substrate and the power of the laser beam of the laser system used for introducing the one or more pixels into the substrate of the photolithographic mask; and
    controlling the at least one laser beam parameter of the laser system based on the at least one of the fitted curve or the look-up table having information about the relationship between the change in the birefringence and the power of the laser beam of the laser system when writing one or more pixels into the substrate of the photolithographic mask in order to correct the one or more errors of the photolithographic mask.

16. The method of claim 15, comprising establishing a relation between the change in birefringence of the substrate with the optical transmission variation of the substrate caused by the one or more pixels to be introduced into the substrate for each of a plurality of types of photolithographic mask substrates.

17. The method of claim 15, wherein the substrate has a coating on a rear surface of the substrate, the coating being electrically conductive and at least partially optically transmissive at the wavelength at which the one or more pixels are to be introduced into the substrate, and
  wherein the method further comprises determining the optical transmission variation of the substrate and/or the coating as a function of the depth of the substrate where the one or more pixels are to be introduced into the substrate.

18. A method for determining an effect of one or more pixels to be introduced into a substrate of a photolithographic mask for at least partly correcting one or more errors of the photolithographic mask, the photolithographic mask having one or more pattern elements, wherein one or more calibration pixels serve to determine a fitted curve that can be used for controlling a pixel writing that at least partly corrects the one or more errors of the photolithographic mask, the method comprising:

determining a change in birefringence of the substrate of the photolithographic mask as a function of at least one laser beam parameter of a laser system used for introducing the one or more calibration pixels into the substrate of the photolithographic mask, wherein the laser system has a wavelength that is larger than an actinic wavelength of the photolithographic mask, the actinic wavelength being the wavelength the photolithographic mask is designed for illuminating a photoresist on a wafer;

determining an optical transmission variation of the substrate of the photolithographic mask as a function of the at least one laser beam parameter; and determining the fitted curve representing a relationship between the change in birefringence of the substrate with the optical transmission variation of the substrate caused by the one or more calibration pixels introduced into the substrate, wherein the at least one laser beam parameter is a parameter.

19. The method of claim 18, comprising using measurements of changes in the birefringence of the substrate for calibration of a defect correction process for the photolithographic mask.

* * * * *

UNITED STATES PATENT AND TRADEMARK OFFICE
CERTIFICATE OF CORRECTION

PATENT NO. : 11,914,289 B2
APPLICATION NO. : 17/140340
DATED : February 27, 2024
INVENTOR(S) : Joachim Welte et al.

It is certified that error appears in the above-identified patent and that said Letters Patent is hereby corrected as shown below:

In the Specification

Column 4
Line 24, delete "mask" and insert -- mask. --

Column 6
Line 46, delete "2 nm- —50 nm" and insert -- 2 nm - 50 nm --

Column 8
Line 26, delete "of a of a" and insert -- of a --

Column 10
Line 14, delete "ZERODUIR®," and insert -- ZERODUR®, --

Column 11
Line 67, delete "s" and insert -- $\varepsilon$ --

Signed and Sealed this
Sixteenth Day of April, 2024

Katherine Kelly Vidal
Director of the United States Patent and Trademark Office